(12) United States Patent
Lee (10) Patent No.: US 7,835,193 B2
(45) Date of Patent: Nov. 16, 2010

(54) FLASH MEMORY DEVICE AND METHOD OF ERASING FLASH MEMORY DEVICE

(75) Inventor: Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 322 days.

(21) Appl. No.: 12/109,721

(22) Filed: Apr. 25, 2008

(65) Prior Publication Data

US 2008/0285355 A1    Nov. 20, 2008

(30) Foreign Application Priority Data

May 18, 2007    (KR) ................... 10-2007-0048791

(51) Int. Cl.
*G11C 16/04*    (2006.01)
(52) U.S. Cl. ................... 365/185.29; 365/185.33; 365/185.23; 365/185.17
(58) Field of Classification Search ............ 365/185.29, 365/185.33, 185.23, 185.17
See application file for complete search history.

(56) References Cited

U.S. PATENT DOCUMENTS

| 7,372,738 | B2 | 5/2008 | Choi et al. | |
|---|---|---|---|---|
| 7,397,706 | B2 | 7/2008 | Byeon et al. | |
| 2007/0047327 | A1* | 3/2007 | Goda et al. | 365/185.29 |
| 2007/0047328 | A1* | 3/2007 | Kim | 365/185.29 |

FOREIGN PATENT DOCUMENTS

| JP | 2002-133881 | 5/2002 |
|---|---|---|
| KR | 100170707 B1 | 10/1998 |
| KR | 1020050002245 A | 1/2005 |
| KR | 1020060129806 | 12/2006 |
| KR | 1020070023180 A | 2/2007 |
| KR | 1020070028656 | 3/2007 |

* cited by examiner

*Primary Examiner*—Tuan T Nguyen
*Assistant Examiner*—Toan Le
(74) *Attorney, Agent, or Firm*—Volentine & Whitt, P.L.L.C.

(57) ABSTRACT

A flash memory device includes a cell array and a voltage supplying and selecting portion. The cell array includes multiple word lines, and the voltage supplying and selecting portion is configured to generate at least two different voltages to be supplied to the word lines of the cell array during an erase operation.

16 Claims, 7 Drawing Sheets

FLASH MEMORY DEVICE AND METHOD OF ERASING FLASH MEMORY DEVICE

CROSS-REFERENCE TO RELATED APPLICATIONS

A claim of priority is made to Korean Patent Application No. 10-2007-0048791, f iled on May 18, 2007, the subject matter of which is hereby incorporated by reference.

BACKGROUND

The present invention relates to semiconductor memory, and more particularly, to a flash memory device and a method of erasing a flash memory device.

Semiconductor memory devices are generally classified into volatile semiconductor memory devices and nonvolatile semiconductor memory devices. An advantage of volatile semiconductor memory devices is that read and write speeds are fast and a disadvantage is that stored contents are lost when power is removed. In comparison, nonvolatile semiconductor memory devices retain stored contents even when power is turned off. Therefore, nonvolatile semiconductor memory devices may be used for applications that require contents to be stored regardless of whether power is on. Nonvolatile semiconductor memory devices may include, for example, mask read-only memory (MROM), programmable read-only memory (PROM), erasable programmable read-only memory (EPROM), electrically erasable programmable read-only memory (EEPROM), and the like.

Among non-volatile semiconductor memories, however, MROM, PROM and EPROM cannot be erased and written to by a system itself, so it is difficult for general users to update stored contents. In contrast, EEPROM is capable of being electrically erased or written. Therefore, uses of EEPROM applications have expanded to auxiliary memories or system programming requiring frequent or continuous updates (e.g., flash EEPROM). A flash EEPROM, in particular, exhibits a higher degree of integration than a conventional EEPROM, and thus is particularly suitable for large auxiliary memory applications. A NAND-type flash EEPROM (referred to as a NAND flash memory device) enables a higher degree of integration than other types of flash EEPROMs.

A flash memory device is an integrated circuit capable of storing information and reading stored information, as needed. A flash memory device may include multiple memory cells that are rewritable. Each memory cell may store one-bit data or multi-bit data. A flash memory device has increased functionality through high integration, volume and chip size.

Recently, to meet the need for large memory devices, multi-bit memory devices have been developed that are capable of storing multi-bit data per cell. When one-bit data is stored in a memory cell, the memory cell may have one of two threshold voltage distributions, i.e., a threshold voltage distribution corresponding to data "1" or data "0." When two-bit data are stored in a memory cell, the memory cell may have one of four possible threshold voltage distributions. Further, when three-bit data are stored in a memory cell, the memory cell may have one of eight possible threshold voltage distributions. Endeavors have been made to store four-bit data per cell, which further increases the number of possible threshold voltage distributions.

In multi-bit flash memory devices, threshold voltage distributions/states corresponding to $2^M$ (where M is a data bit number) may be distributed within a limited threshold voltage window. Accordingly, improved program and erase techniques are needed to efficiently program memory cells to any one of threshold voltage distributions within a limited threshold voltage window.

SUMMARY OF THE INVENTION

One aspect of the present invention provides a flash memory device. The flash memory device includes a cell array having multiple word lines, and a voltage supplying and selecting portion configured to generate at least two different voltages to be supplied to the word lines during an erase operation.

Another aspect of the present invention provides a method of erasing a flash memory device, which includes multiple word lines and multiple memory cells. The method includes generating different word line voltages, applying an erase voltage to a bulk of the memory cells and selectively applying the different word line voltages to the word lines.

Still other aspect of the present invention provides a method of erasing a flash memory device, which includes at least two word lines. The method includes applying a first electric field between a bulk and a first word line of the at least two word lines and applying a second electric field between the bulk and a second word line of the at least two word lines. The first electric field is different in strength from the second electric field.

BRIEF DESCRIPTION OF THE FIGURES

Non-limiting and non-exhaustive embodiments of the present invention will be described with reference to the attached drawings.

DETAILED DESCRIPTION OF THE EMBODIMENTS

The present invention will now be described more fully with reference to the accompanying drawings, in which exemplary embodiments of the invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 1:
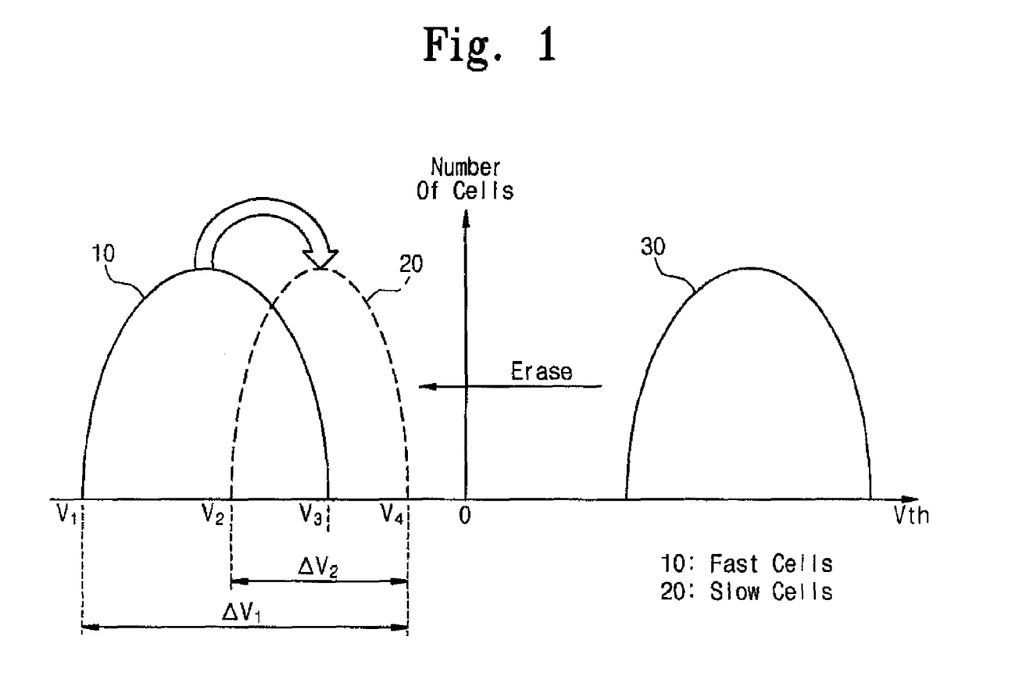
FIG. 1 is a diagram showing an erase method, according to an exemplary embodiment of the present invention.

FIG. 1 is a diagram showing an erase method of a flash memory device, according to an illustrative embodiment of the present invention.

Referring to FIG. 1, memory cells of a flash memory device may have different erase speeds, according to erase coupling ratios, for example, which may be determined when word lines are formed. Differences between erase coupling ratios may result from a number of factors, such as fabrication process variations, physical locations of word lines within a memory block, etc. In accordance with the depicted erase method, it is possible to reduce a difference between erase speeds of memory cells in one memory block, as described blow.

Memory cells programmed to a program state 30 may have threshold voltages corresponding to an erase state through an erase operation. However, some of the memory cells may have relatively large erase coupling ratios. Although the memory cells with the large erase coupling ratios are erased under the same bias condition, their corresponding threshold voltages may be shifted at a relatively slow speed. Such memory cells may be referred to as "slow cells." In contrast, memory cells with a relatively fast erase speed may be referred to as "fast cells."

In other words, although memory cells are erased under the same bias condition and erase time, they may have different threshold voltages due to different erase speeds of memory cells.

It is difficult to reduce the difference between erase speeds of fast and slow memory cells based on an erase operation performed in the same erase time and under the same bias condition. During an erase operation according to the exemplary erase method, the erase speed of fast cells 10 may coincide with that of slow cells 20. This may be accomplished by controlling a word line voltage for the fast cells 10 to be higher than a word line voltage for the slow cells 20. As a result, the erase speed may be reduced by reducing an electric field induced at a float gate of each fast cell 10 to be lower than a normal electric field. During an erase operation, a word line voltage may be controlled such that a shift speed of threshold voltages of the fast cells 10 is the same as that of threshold voltages of the slow cells 20.

In accordance with the exemplary erase method illustrated in FIG. 1, a threshold voltage distribution of an erase state is improved, as indicated by the voltage range $\Delta V2$, which has been reduced from the voltage range $\Delta V1$. It is possible to provide an efficient program condition by improving the threshold voltage distribution corresponding to the erase state. In FIG. 1, the erase speed of fast cells 10 is reduced to that of slow cells 20. However, it would be apparent to one skilled in the art that the present invention is not limited to this example. For example, the bias condition of the erase operation can be changed such that an erase speed of slow cells 20 is increased to that of fast cells 10.

Figure 2:
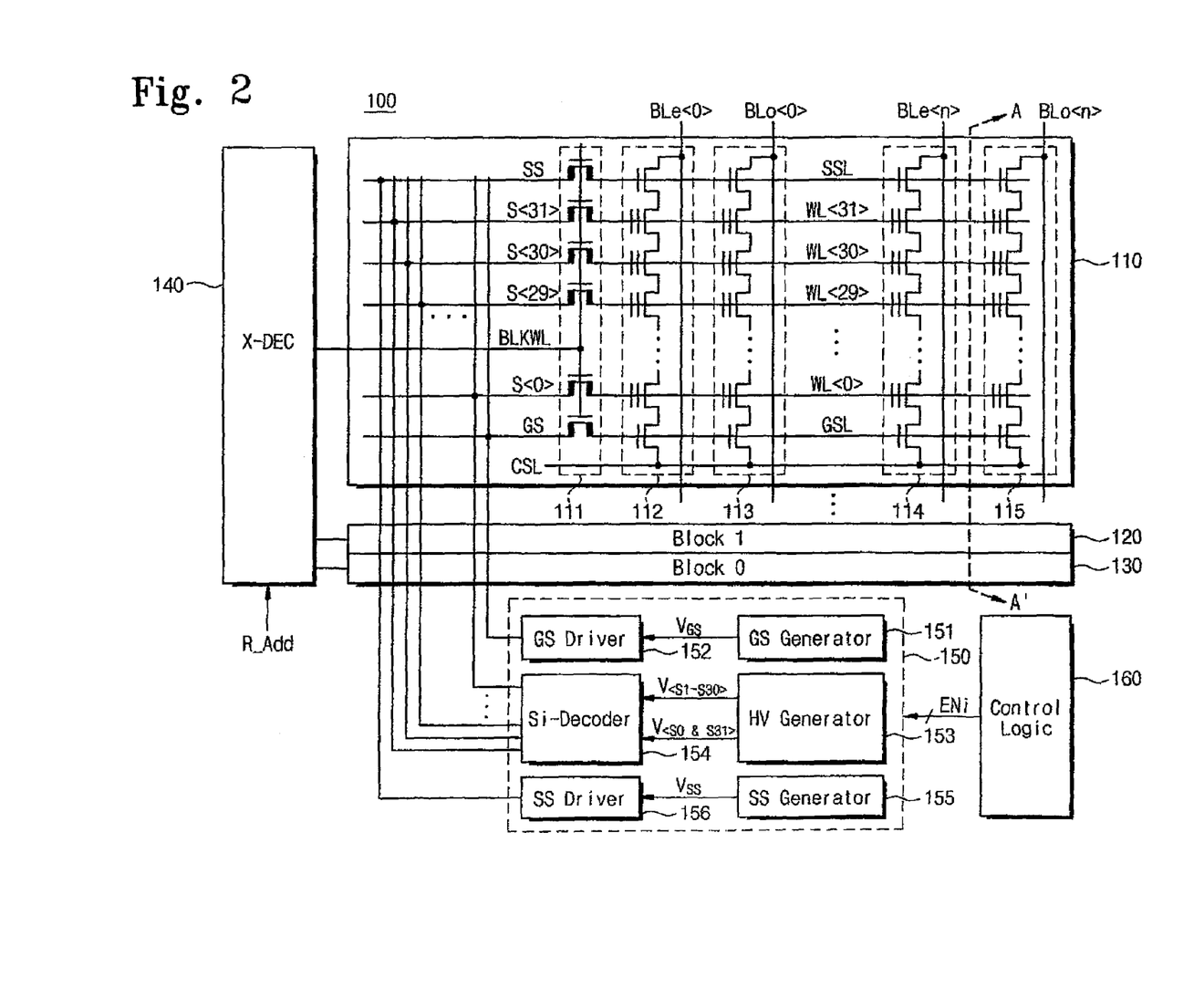
FIG. 2 is a block diagram showing a flash memory device, according to an exemplary embodiment of the present invention.

FIG. 2 is a block diagram showing a flash memory device according to an illustrative embodiment of the present invention.

Referring to FIG. 2, a flash memory device 100 includes a high voltage generator 153 that generates word line voltages $V_{<S1~S30>}$ applied to fast cells 10 (refer to FIG. 1) in an erase operation. The flash memory device 100 further includes multiple memory blocks 110~130, each having an array of memory cells respectively connected between even/odd bit lines (e.g., BLe<0>~BLe<n>; BLo<0>~BLo<n>) and word lines (e.g., WL<0>~WL<31>). The memory blocks 110~130 are supplied with the word line voltages generated by the high voltage generator 153 during an erase operation.

Each of the memory blocks 110~130 may be selected by a corresponding block select signal BLKWL from a row decoder 140. During an erase operation, a high voltage switch stage 111 is activated in response to the block select signal BLKWL from the row decoder 140. At this time, select signals SS and GS are transferred to select lines SSL and GSL, respectively, and word line voltages S<0>~S<31> are transferred to word lines WL<0>~WL<31>, respectively.

The row decoder 140 may be configured to select a memory block in response to a row address R_Add. For example, during erase, program or read operations, the row decoder 140 may activate the block select signal BLKWL of a memory block to be selected. When the block select signal BLKWL is activated, the high voltage switch stage 111 of the selected memory block is activated. This enables the select signals SS and GS to be are transferred to the select lines SSL and GSL, and the word line voltage signals S<0>~S<31> to be transferred to the word lines WL<0>~WL<31>.

A voltage supply 150 may be configured to generate voltages to be supplied to the various lines SSL, GSL and WL<0>~WL<31>. During an erase operation, for example, the voltage supply 150 generates a word line voltage that is either a relatively high word line voltage or a relatively low word line voltage. The relatively high word line voltage may be applied to word lines connected to fast cells, and the relatively low word line voltage may be applied to word lines connected to slow cells. A detailed description of the voltage supply 150 follows.

A ground select signal generator 151 generates a voltage $V_{GS}$ corresponding to a ground select signal GS. The voltage $V_{GS}$ may be transferred to a ground select line GSL of a selected memory block via a ground select signal driver 152. A high voltage generator 153 and a word line decoder 154 supply word line voltages that are transferred to memory blocks 110~130. During an erase operation, the high voltage generator 153 and the word line decoder 154 supply a word line voltage of 0.3V, for example, to word lines (e.g., WL<0> and WL<31>) adjacent to select lines GSL and SSL, respectively. At the same time, the high voltage generator 153 and the word line decoder 154 supply a word line voltage of 1.0V, for example, to the remaining word lines (e.g., WL<1>~WL<30>).

In other words, the high voltage generator 153 generates voltages with different levels, which are supplied to word lines connected to slow cells and word lines connected with fast cells, respectively. That is, the high voltage generator 153 may simultaneously generate a word line voltage $V_{<S0\&S31>}$ to be supplied to word lines connected with slow cells and a word line voltage $V_{<S1~S30>}$ to be supplied to word lines connected with fast cells. The word line decoder 154 may transfer word line voltages of different levels from the high voltage generator 153 to corresponding word lines during the erase operation. In accordance with this voltage supply scheme, it is possible to reduce the erase speed of memory cells that have a relatively fast erase speed. Accordingly, the difference between erase speeds of fast and slow cells, which may result from physical positions of the word lines, for example, is likewise reduced or minimized.

In the depicted embodiment, it is assumed for purposes of discussion that word lines WL<0> and WL<31> correspond to slow cells. However, the various embodiments of the present invention are not limited to this arrangement. For example, word lines corresponding to slow cells optionally may be selected according to process characteristics. Based on setting the word line decoder 154, a low word line voltage may be supplied during an erase operation. In this case, during a test operation, it is possible to detect information with respect to word lines corresponding to slow cells and fast cells. The word line decoder 154 may be set according to the information detected during the test operation.

A string select signal generator 155 generates a voltage $V_{SS}$ to be supplied to a string select signal SS, and a string select signal driver 156 transfers the voltage $V_{SS}$ from the string select signal generator 155 to select signal line SSL.

Control logic 160 may control generation of the select signals SS and GS and the word line voltage signals S<0>~S<31> according to each mode of operation, such as program, erase and read modes of operation. In other words, the control logic 160 is configure to control the ground select signal generator 151, the string select signal generator 155 and the high voltage generator 153. In particular, during an erase operation, the control logic 160 controls the high voltage generator 153 to generate word line voltages having different levels.

In the depicted embodiment, the switch stage 111, the voltage supply 150 and the control logic 160 constitute a voltage supplying and selecting portion that is configured to generate and supply at least two different voltages to the word lines during an erase operation.

As understood from the above description, the flash memory device 100 is configured such that word line voltages with different levels are supplied to word lines during an erase operation. In particular, word lines corresponding to fast cells are supplied with a word line voltage higher than that supplied to word lines corresponding to slow cells, so that an erase speed difference can be reduced or minimized.

Figure 3:
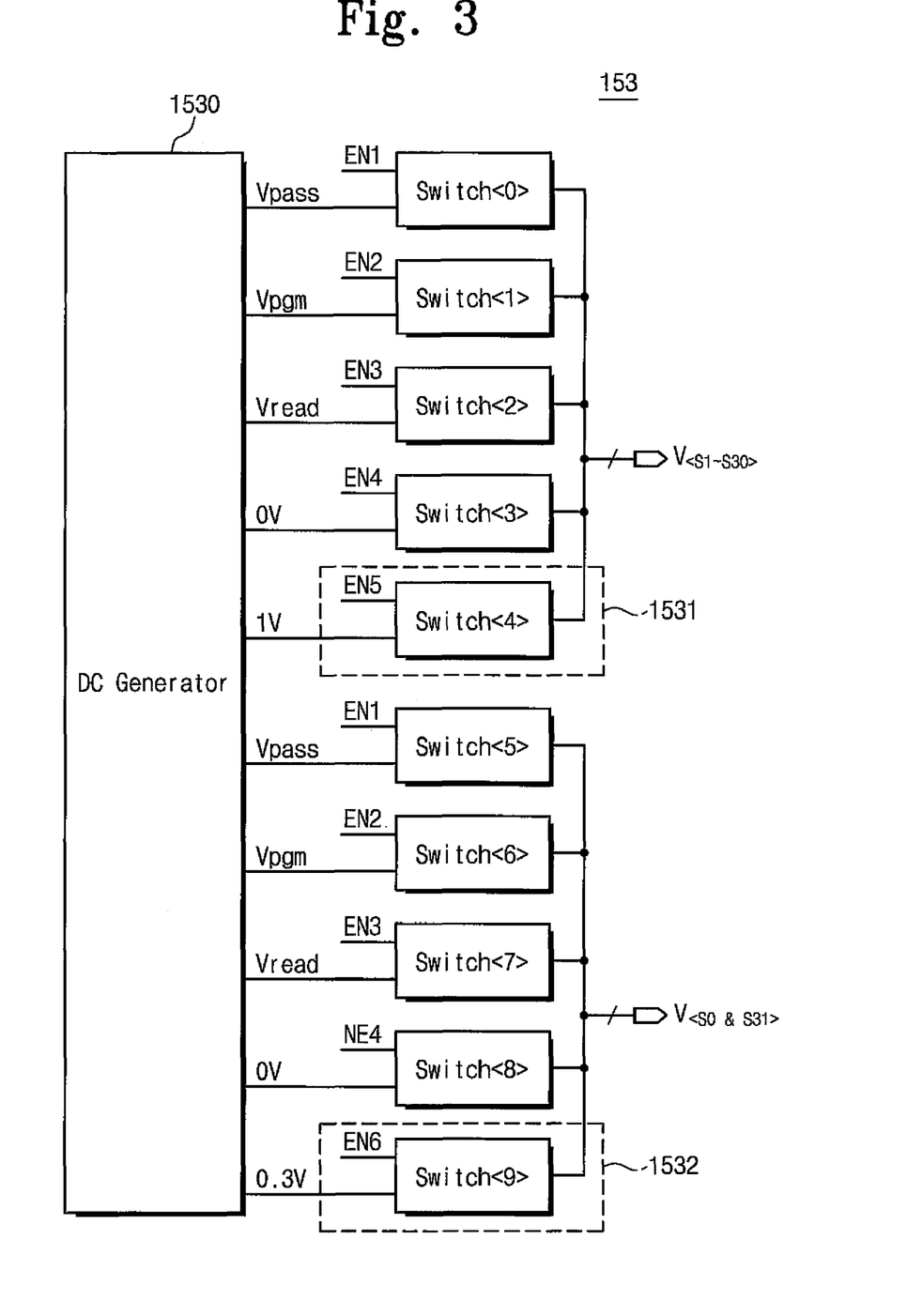
FIG. 3 is a block diagram showing a high voltage generator illustrated in FIG. 2, according to an exemplary embodiment of the present invention.

FIG. 3 is a block diagram showing a high voltage generator illustrated in FIG. 2, according to an illustrative embodiment of the present invention.

Referring to FIG. 3, the high voltage generator 153 generates word line voltages required for program, read and erase operations. During an erase operation, the high voltage generator 153 may generate a word line voltage of 0.3V to be supplied to word lines connected with slow cells and a word line voltage of 1.0V to be supplied to word lines connected with fast cells, for example.

The high voltage generator 153 includes a DC voltage generator 1530, which generates DC voltages that are supplied to selected word lines in response to each mode of operation. The DC voltage generator 1530 may be configured to generate a high voltage in response to a mode of operation (e.g., a program, erase or read mode of operation). For example, the DC voltage generator 1530 may be configured to generate program and pass voltages Vpgm and Vpass as a word line voltage in a program mode of operation. The DC voltage generator 1530 may also produce a high voltage using a charge pump during a high voltage enable interval, and the high voltage may be regulated into required voltages (e.g., Vpgm and Vpass) by a regulator (not shown). In the program mode, the DC voltage generator 1530 may generate the program voltage Vpgm to be supplied to a selected word line and a pass voltage Vpass (e.g., about 8V) to be supplied to unselected word lines. The pass voltage Vpass and the program voltage Vpgm may be controlled by enable signals EN1 and EN2, respectively.

However, in an erase operation, the DC voltage generator 1530 may generate a word line voltage of 1.0V to be supplied to word lines connected to fast cells and a word line voltage of 0.3V to be supplied to word lines connected to slow cells at the same time. A switch 1531 is turned on to transfer the word line voltage of 1.0V to word lines (e.g., WL<1>~WL<30>) corresponding to fast cells. The switch 1531 is turned on when an enable signal EN5 is activated. At the same time, a switch 1532 is turned on to transfer the word line voltage of 0.3V to word lines (e.g., WL<0> and WL<31>) corresponding to slow cells. The switch 1532 is turned on when an enable signal EN6 is activated. It is possible to reduce the erase speed difference between erased memory cells by supplying the word line voltage of 1.0V to word lines (e.g., WL<1>~WL<30>) corresponding to fast cells and the word line voltage of 0.3V to word lines (e.g., WL<0> and WL<31>) corresponding to slow cells.

Figure 4:
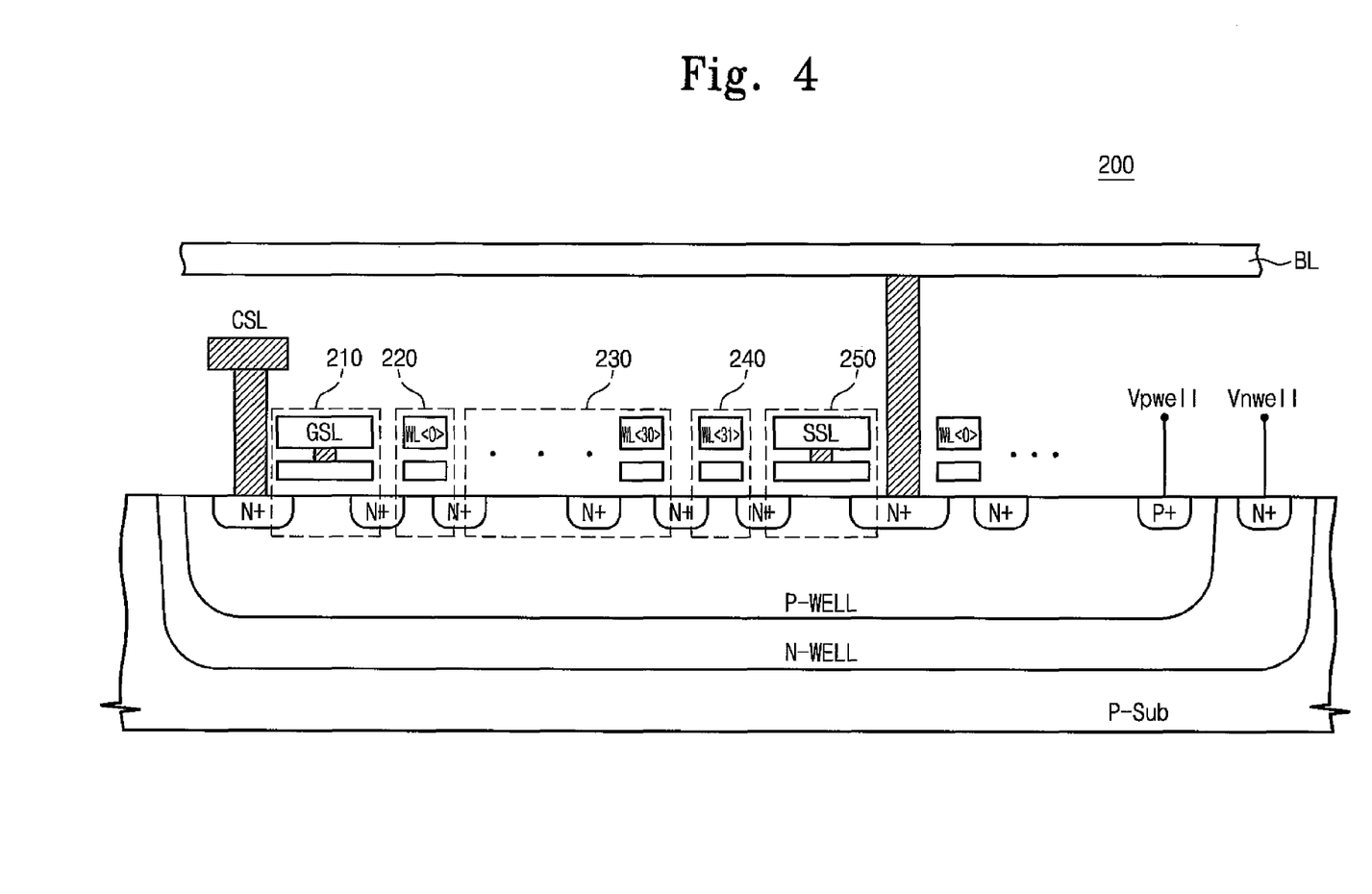
FIG. 4 is a diagram showing a cross-section taken along a dotted line A-A' in FIG. 2, according to an exemplary embodiment of the present invention.

FIG. 4 is a diagram showing a cross-section 200 of the flash memory device 100 taken along a dotted line A-A' in FIG. 2, according to an illustrative embodiment of the invention.

Referring to FIG. 4, cell transistors 220~240 in a cell string are formed between contact plugs (hatched portions in FIG. 4) that extend to a bit line BL and a common source line CSL, respectively. The cell transistors 220~240 are connected to the bit line BL through a string select transistor 250 and to the common source line CSL through a ground select transistor 210.

During an erase operation, an erase voltage Vers of about 20V may be applied to a bulk region (P-well and N-well). At the same time, word lines WL<1>~WL<30> are supplied with a word line voltage of about 1.0V from the voltage supply 150 (refer to FIG. 2), respectively, and word lines WL<0> and WL<31> are supplied with a word line voltage of about 0.3V from the voltage supply 150, respectively. At this time, the select transistors 210 and 250 may be biased to be floated. Under the bias condition, an electric field corresponding to a potential difference of about 20V is applied between a control gate and a channel of each of the cell transistors 220~240. Accordingly, electrons injected into a floating gate of each cell transistor are discharged into the cell transistor channel, so that the cell transistors 210~240 are erased.

As illustrated in FIG. 4, the select transistors 210 and 250 may have different sizes than the cell transistors 210~240, for example, to enable connections with the common source line CSL and the bit line BL, respectively. The cell string may be activated by turning on the select transistors 210 and 250 in response to a ground select signal GS and a string select signal SS, respectively. The select transistors 210 and 250 require the capacity for switching relatively large currents that flow the channels of the cell transistors.

Further, although the select transistors 210 and 250 have the same basic structure as the cell transistors 210~240, they require additional photoresist and etching processes during fabrication to connect a float gate and a control gate of each select transistor. For this reason, the select transistors 210 and 250 are larger than each cell transistor. Accordingly, coupling ratios between the select transistors 210 and 250 and adjacent cell transistors 220 and 240 are greater than coupling ratios between the select transistors 210 and 250 and non-adjacent cell transistors 230. This causes the cell transistors 220 and 240 (corresponding to word lines WL<0> and WL<31>) to be erased at slower erase speeds, as compared to the remaining cell transistors 230 (corresponding to word lines WL<1>~WL<30>). Similarly, program characteristics of the cell transistors adjacent to the select transistors 210 and 250 are different from those of the non-adjacent cell transistors.

According to embodiments of the present invention, a voltage higher than about 0.3V may be applied to word lines WL<1>~WL<30> corresponding to the cell transistors 230 during an erase operation. For example, during an erase operation, a word line voltage of about 1.0V may be applied to word lines that correspond to cell transistors 230, defined as fast cells. A word line voltage of about 0.3V may be applied to word lines that correspond to cell transistors 210 and 240, defined as slow cells. When an erase voltage Vers is applied to a bulk region under the above-described bias condition, the erase speed of each fast cell is reduced. That is, a first electric field, formed by the potential difference between 1.0V and the erase voltage Vers, is applied between the bulk region and word lines WL<1>~WL<30>, and a second electric field, formed by the potential difference between 0.3V and the erase voltage Vers, is applied between the bulk and word lines WL<0> and WL<31>. Accordingly, the difference between erase speeds of fast cells and slow cells is reduced.

Although the example described above includes applying a word line voltage of about 1.0V to word lines of fast cells, other word line voltages may be selected to reduce or minimize erase speed differences.

Figure 5:
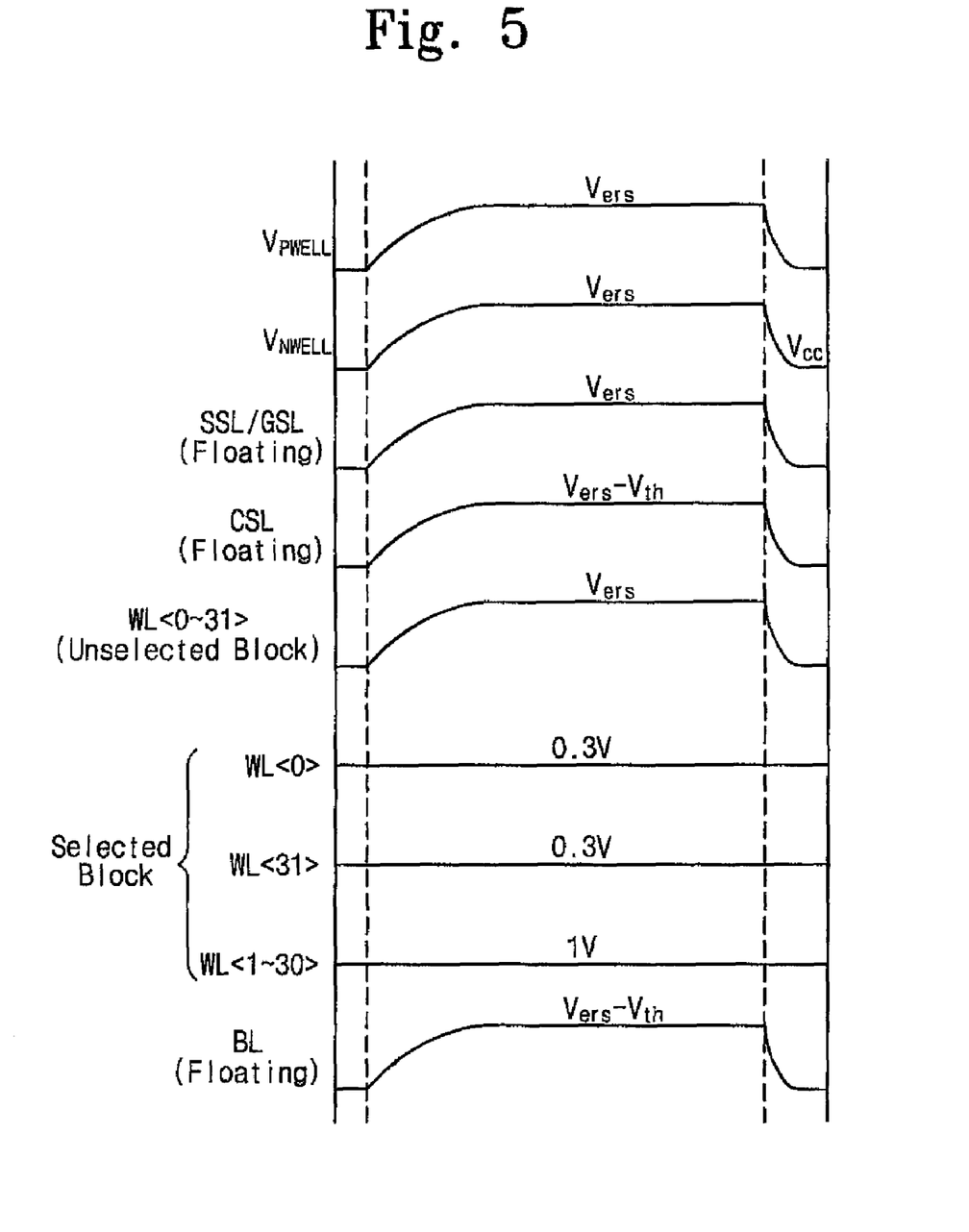
FIG. 5 is a diagram showing a bias condition during an erase operation, according to an exemplary embodiment of the present invention.

FIG. 5 is a diagram showing a bias condition during an erase operation, according to an illustrative embodiment of the present invention. During the erase operation, as illustrated in FIG. 5, different voltages may be applied to word lines WL<1>~WL<30> corresponding to fast cells and word lines WL<0> and WL<31> corresponding to slow cells, as more fully described below.

Once the erase operation commences, an erase voltage Vers is applied to a bulk region (e.g., P-well and N-well), and the string select line SSL and ground select line GSL may be floated. Likewise, a bit line BL and a common source line CSL may be floated. Word lines in memory blocks other than the memory blocks selected for erasing may also be floated.

With respect to the selected memory blocks, a word line voltage of about 0.3V may be applied to word lines WL<0> and WL<31> corresponding to selected slow cells, while a word line voltage of about 1.0V may be applied to word lines WL<1>~WL<30> corresponding to selected fast cells. In accordance with the above-described bias condition, an electric field between a channel and a control gate of each fast cell is reduced in strength, as compared to the situation in which all word lines are biased with the same word line voltage. Therefore, an erase speed of each fast cell may be reduced, e.g., so that it is similar to or the same as the erase speed of each slow cell. Since word lines in unselected memory blocks are set to a floating state, voltages on the word lines in the unselected memory blocks may be boosted up to an erase voltage. This makes it possible to prevent memory cells in the unselected memory blocks from being erased.

In accordance with the bias condition, during an erase operation, word lines (e.g., WL<1>~WL<30>) corresponding to fast cells are driven with a relatively high voltage, and word lines (e.g., WL<0> and WL<31>) corresponding to slow cells are driven with a relative low voltage. In other embodiments, the same result may be effectively obtained by lowering the word line voltage supplied to word lines WL<0> and WL<31> corresponding to slow cells.

Figure 6:
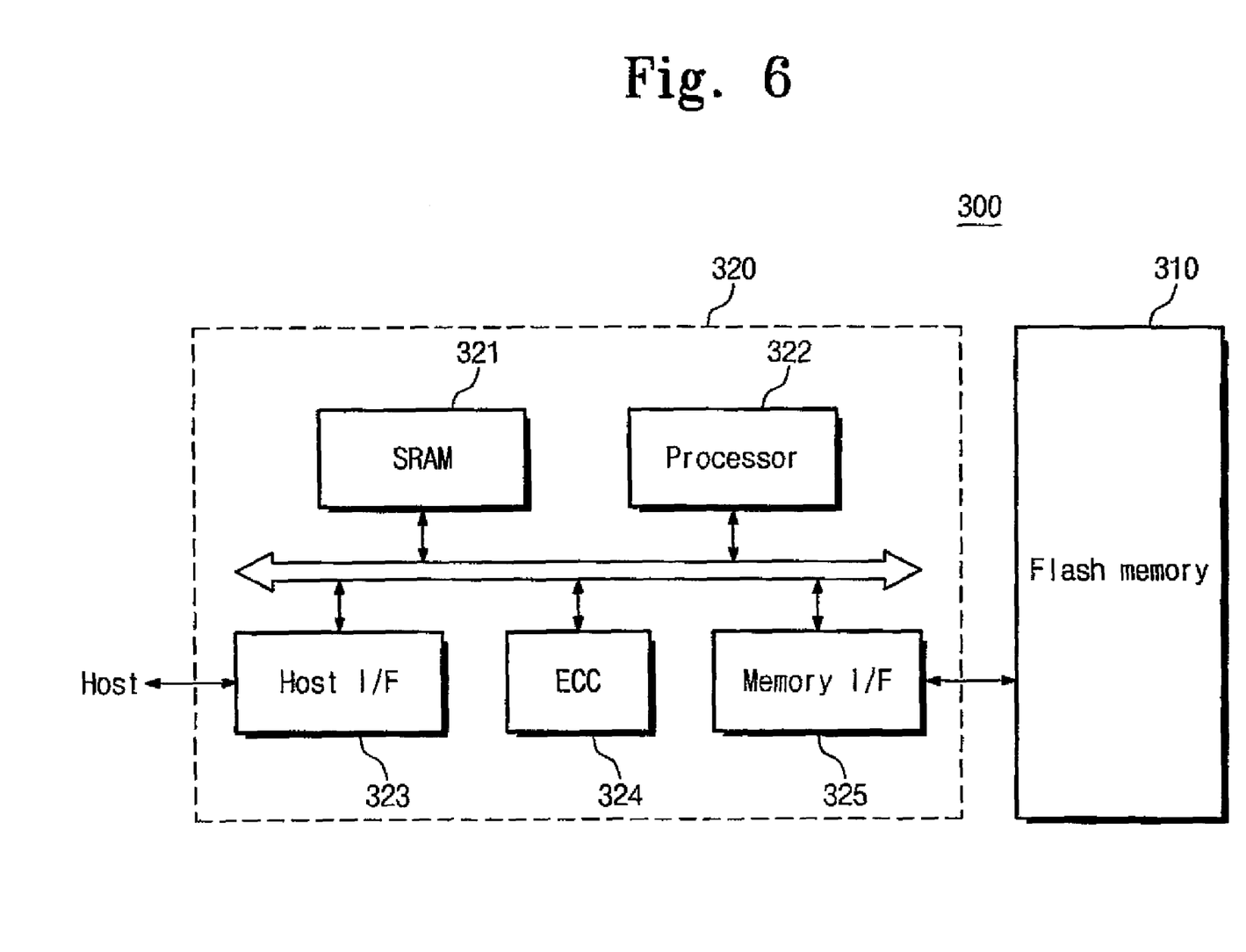
FIG. 6 is a block diagram showing a memory card, according to an exemplary embodiment of the present invention.

FIG. 6 is a block diagram showing a memory card, according to an illustrative embodiment of the present invention.

Referring to FIG. 6, a memory card 300 supports a large-volume data storage capacity and includes a flash memory device 310, according to embodiments of the present invention. The memory card 300 further includes a memory controller 320 that is configured to control data exchanges between a Host and the flash memory device 310.

The memory controller 320 includes SRAM 321, which is used as an operating memory of processor 322, and a host interface 323, which implements a data exchange protocol corresponding to the Host connected to the memory card 300. Error correction code (ECC) 324 is configured to detect and correct errors in data read from the flash memory device 310, which may store N-bit data per cell (where N is an integer greater than or equal to 1). A memory interface 325 is configured to interface with the flash memory device 310. The processing unit 322 is configured to control the data exchange of the memory controller 320. Although not shown, the memory card 300 may further include ROM to store code data for interfacing with the Host.

In accordance with the memory card being a memory system, it is possible to provide high reliability and efficiency using the flash memory device 310, implemented according to embodiments of the present invention. For example, the flash memory device 310 may be applied as a memory system, such as a solid state disk (SSD). In this case, it is possible to improve program characteristics effectively.

Figure 7:
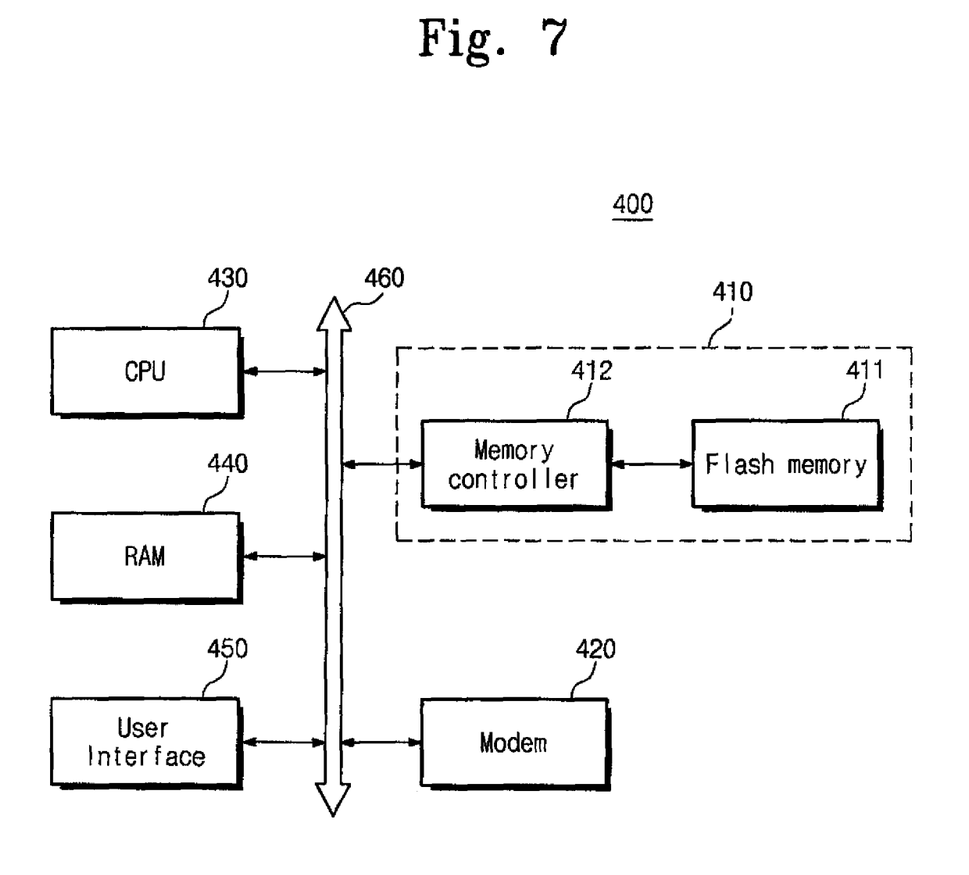
FIG. 7 is a block diagram showing a computing system, according to an exemplary embodiment of the present invention.

FIG. 7 is a block diagram showing a computing system, according to an illustrative embodiment of the present invention.

Referring to FIG. 7, a computing system 400, such as a mobile device, a laptop computer, a desktop computer, etc., may include a flash memory system 410, implemented according to embodiments the present invention. The computing system 400 may further include CPU 430, RAM 440, user interface 450 and MODEM 420, which are electrically connected to bus 460, as well as the flash memory system 410. The flash memory system 410 includes a memory controller 412 and a flash memory device 411. The flash memory system 410 may be configured substantially the same as the memory card 300, described with respect to FIG. 6. Data provided via the user interface 450 or processed by the CPU 430 may be stored in the flash memory device 411 through the memory controller 412. It is possible to install an SSD incorporating embodiments of the invention instead of the flash memory system 410. Although not illustrated in FIG. 7, the computing system 400 may further include application chipsets, camera image processors, and the like.

As set forth above, a flash memory device and a memory system according to embodiments the present invention improve a threshold voltage distribution corresponding to an erase state of memory cells by using different word line voltages during an erase operation.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device comprising:
   a cell array comprising a plurality of word lines including a first word line connected to a first memory cell of the cell array having a fast erase speed and a second word line connected to a second memory cell of the cell array having a slow erase speed;
   a memory block comprising the cell array and at least one select line used to select the memory block, the second word line of the plurality of word lines being adjacent to the at least one select line, and the first word line of the plurality of word lines being not adjacent to the at least one select line; and
   a voltage supplying and selecting portion configured to generate at least two different voltages to be supplied to the plurality of word lines during an erase operation.

2. The flash memory device of claim 1, wherein, during the erase operation, the voltage supplying and selecting portion generates a first word line voltage to be supplied to the first word line and a second word line voltage to be supplied to the second word line, the first word line voltage being greater than the second word line voltage.

3. The flash memory device of claim 2, wherein the voltage supplying and selecting portion comprises:

a voltage supplier configured to generate the first and second word line voltages; and a switch stage configured to transfer the first word line voltage to the first word line and the second word line voltage to the second word line in response to an erase operation mode signal.

4. The flash memory device of claim 3, further comprising:
a decoder configured to selectively provide the first and second word line voltages from the switch stage to the plurality of word lines.

5. The flash memory device of claim 3, wherein the voltage supplying and selecting portion further comprises control logic for generating the erase operation mode signal during the erase operation.

6. The flash memory device of claim 1, wherein the at least one select line comprises one of a string select line and a ground select line.

7. The flash memory device of claim 1, wherein the first word line is separated from the at least one select line by at least the second word line.

8. The flash memory device of claim 1, wherein the voltage supplying and selecting portion simultaneously generates the at least two different voltages to be supplied to the plurality of word lines during the erase operation.

9. A method of erasing a flash memory device, comprising a plurality of word lines and a plurality of memory cells, the method comprising:
generating different first and second word line voltages; and applying an erase voltage to a bulk of the plurality of memory cells during an erase operation;

selectively applying the first word line voltage to a first word line of the plurality of word lines during the erase operation. the first word line being connected with memory cells of the plurality of memory cells having a relatively fast erase speed; and selectively applying the second word line voltage to a second word line of the plurality of word lines d the second word line being in connected with memory cells of the plurality of memory cells having a relatively slow erase speed, wherein the second word line is adjacent to one of a string select line and a ground select line, and the first word line is not adjacent either of the string select line and the ground select line.

10. The erase method of claim 9, wherein the first word line voltage being is higher than the second word line voltage.

11. The erase method of claim 9, wherein the first and second word line voltages are generated simultaneously.

12. A method of erasing a flash memory device, comprising a cell array and at least two word lines connected to memory cells of the cell array, the method comprising:
applying a first electric field between a bulk and a first word line of the at least two word lines;

applying a second electric field between the bulk and a second word line of the at least two word lines, the first electric field being different in strength from the second electric field;

supplying the first word line with a first voltage; and supplying the second word line a second voltage lower than the first voltage, wherein the second word line is adjacent to one of a string select line and a ground select line, and the first word line is not adjacent to either one of the string select line and the ground select line.

13. The erase method of claim 12, wherein the first electric field is formed by a potential difference between the first voltage and an erase voltage applied to the bulk.

14. The erase method of claim 13, wherein the second electric field is formed by a potential difference between the second voltage and the erase voltage.

15. The erase method of claim 12, wherein the first electric field and the second electric field are determined to reduce a difference between an erase speed of memory cells connected to the first word line and an erase speed of memory cells connected to the second word line.

16. The erase method of claim 15, wherein the erase speed of the memory cells connected to the first word line is faster than the erase speed of memory cells connected to the second word line.

* * * * *